(12) United States Patent
Chen

(10) Patent No.: US 12,352,800 B2
(45) Date of Patent: Jul. 8, 2025

(54) APPARATUS AND METHOD FOR MEASURING DYNAMIC ON-RESISTANCE OF NITRIDE-BASED SWITCHING DEVICE

(71) Applicant: INNOSCIENCE (SUZHOU) SEMICONDUCTOR CO., LTD., Suzhou (CN)

(72) Inventor: Chang Chen, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/778,024

(22) PCT Filed: Mar. 3, 2022

(86) PCT No.: PCT/CN2022/079106
§ 371 (c)(1),
(2) Date: Sep. 7, 2023

(87) PCT Pub. No.: WO2023/164900
PCT Pub. Date: Sep. 7, 2023

(65) Prior Publication Data
US 2024/0168079 A1 May 23, 2024

(51) Int. Cl.
*G01R 31/26* (2020.01)
*G01R 7/02* (2006.01)
(Continued)

(52) U.S. Cl.
CPC .......... *G01R 31/2621* (2013.01); *G01R 7/02* (2013.01); *G01R 31/2601* (2013.01)

(58) Field of Classification Search
CPC ........ G01R 31/02; G01R 31/26; G01R 31/52; G01R 15/04; G01R 19/00; G01R 27/02; G01R 27/08; G01R 7/02
See application file for complete search history.

(56) References Cited

U.S. PATENT DOCUMENTS

| | | | |
|---|---|---|---|
| 2015/0381148 A1 | 12/2015 | Zeng | |
| 2017/0254842 A1* | 9/2017 | Bahl | G01R 31/2621 |
| 2020/0366279 A1* | 11/2020 | Ma | G01R 31/2607 |

FOREIGN PATENT DOCUMENTS

| | | |
|---|---|---|
| CN | 103760408 A | 4/2014 |
| CN | 105811765 A | 7/2016 |

(Continued)

OTHER PUBLICATIONS

International Search Report and Written Opinion of the corresponding PCT application No. PCT/CN2022/079106 mailed on Nov. 28, 2022.

(Continued)

*Primary Examiner* — Neel D Shah
(74) *Attorney, Agent, or Firm* — Li & Cai Intellectual Property (USA) Office

(57) ABSTRACT

The present disclosure provides an apparatus for measuring dynamic on-resistance of a nitride-based device under test (DUT) comprising a control terminal connected to a controller being configured to generate a control signal to switch on and off the DUT. The apparatus comprising a first clamping module, a second clamping module and a driving module. The driving module is configured to sense a state change of the DUT and generate a control signal to switch on and off the first clamping module based on the state change of the DUT such that when the DUT is at an on-state, an output voltage across the first and second output nodes is clamped to indicate a drain-source voltage of the DUT. The provided apparatus can address the overshoot issues in measurement of dynamic on-resistance of GaN device.

19 Claims, 13 Drawing Sheets

(51) Int. Cl.
*G01R 15/04* (2006.01)
*G01R 19/00* (2006.01)
*G01R 27/02* (2006.01)
*G01R 27/08* (2006.01)
*G01R 31/52* (2020.01)

(56) References Cited

FOREIGN PATENT DOCUMENTS

| | | |
|---|---|---|
| CN | 108718150 A | 10/2018 |
| CN | 110174603 A | 8/2019 |
| CN | 111257719 A | 6/2020 |
| CN | 111426928 A | 7/2020 |
| CN | 112394228 A | 2/2021 |
| CN | 113595047 A | 11/2021 |
| CN | 114128117 A | 3/2022 |
| JP | 2000171517 A | 6/2000 |

OTHER PUBLICATIONS

Ratmir Gelagaev et al., "A Fast Voltage Clamp Circuit for the Accurate Measurement of the Dynamic On-Resistance of Power Transistors," IEEE Transactions on Industrial Electronics, 2015, pp. 1241-1250, vol. 62, No. 2.

Mattia Guacci et al., "On-State Voltage Measurement of Fast Switching Power Semiconductors," CPSS Transactions on Power Electronics and Applications, 2018, pp. 163-176, vol. 3, No. 2.

Grayson Zulauf et al., "Dynamic On-Resistance in GaN-on-Si HEMTs: Origins, Dependencies, and Future Characterization Frameworks," IEEE Transactions on Power Electronics, 2020, pp. 5581-5588, vol. 35, No. 6.

\* cited by examiner

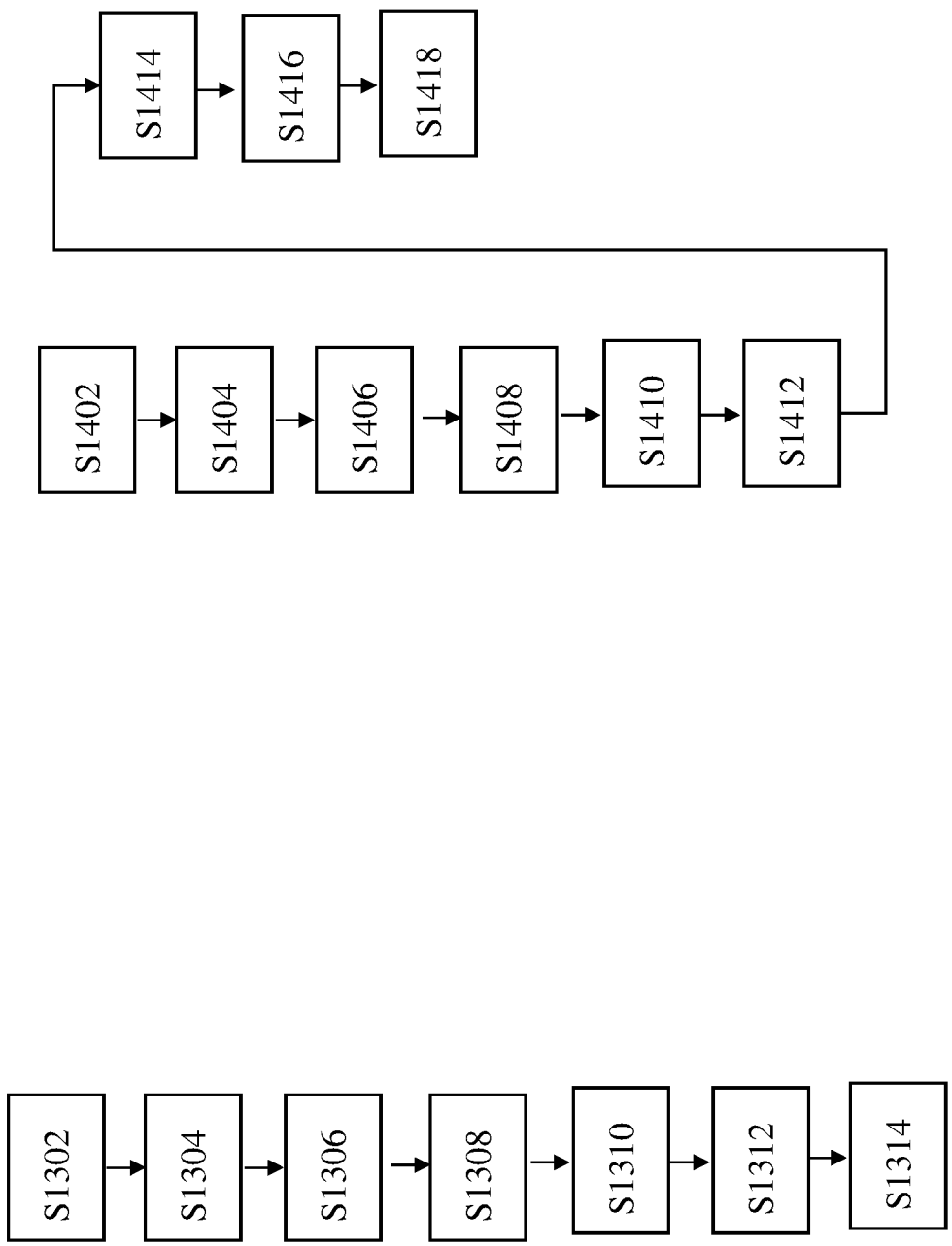

APPARATUS AND METHOD FOR MEASURING DYNAMIC ON-RESISTANCE OF NITRIDE-BASED SWITCHING DEVICE

FIELD OF THE INVENTION

The present invention generally relates to a nitride-based switching device. More specifically, the present invention relates to an apparatus and a method for measuring dynamic on-resistance of a nitride-based device under test (DUT).

BACKGROUND OF THE INVENTION

Gallium nitride (GaN)-based devices have been widely used for various electrical energy conversion systems because of wide bandgap and fast switching transition. In power conversion, the accurate establishment of GaN device loss models is important to optimize circuit design and increase power density. The GaN conduction loss occupies an important part of total conduction loss, it is of great significance for the accurate modeling of the total conduction loss. Due to the characteristics of GaN devices, the dynamic on-resistance is affected by factors such as junction temperature, gate drive voltage, drain-source voltage, etc. in power conversion. Dynamic on-resistance can be obtained by dividing the drain-source voltage by drain-source current during the device conduction interval. The drain-source voltage can be directly measured by an oscilloscope. However, since the drain-source voltage magnitude of GaN device may vary from hundreds of volts at off-state to several millivolts at on-state, overshoot may occur in oscilloscope measurement and it is difficult to obtain accurate test results. Therefore, there is a need for a testing system that can address the overshoot issues in measurement of dynamic on-resistance of GaN device such that an accurate power loss model can be established.

SUMMARY OF THE INVENTION

In accordance with one aspect of the present disclosure, an apparatus is provided for measuring dynamic on-resistance of a nitride-based device under test (DUT) comprising a control terminal connected to a controller being configured to generate a control signal to switch on and off the DUT. The apparatus comprises: an input interface comprising a first input node configured for being electrically connected to a first conduction terminal of the DUT, a second input node configured for being electrically connected to a second conduction terminal of the DUT; an output interface comprising a first output node configured for being electrically connected to a first signal input node of an electrical signal monitoring equipment and a second output node configured for being electrically connected to a second signal input node of the electrical signal monitoring equipment, and the second output node being connected to the second input node; a first clamping module comprising a control terminal, a first conduction terminal electrically connected to the first input node, and a second conduction terminal electrically coupled to the first output node; a second clamping module comprising a first terminal electrically connected to the first output node, and a second terminal electrically connected to the second output node; and a driving module comprising an input terminal electrically connected to the first input node and an output terminal electrically connected to the control terminal of the first clamping module. The driving module is configured to: sense a state change of the DUT; and generate a control signal to switch on and off the first clamping module based on the state change of the DUT such that when the DUT is at an on-state, an output voltage across the first and second output nodes is clamped to indicate a drain-source voltage of the DUT.

In accordance with another aspect of the present disclosure, an apparatus is provided for measuring dynamic on-resistance of a nitride-based device under test (DUT) comprising a control terminal connected to a controller being configured to generate a control signal to switch on and off the DUT. The apparatus comprises: an input interface comprising a first input node configured for being electrically connected to a first conduction terminal of the DUT, a second input node configured for being electrically connected to a second conduction terminal of the DUT; an output interface comprising a first output node configured for being electrically connected to a first signal input node of an electrical signal monitoring equipment and a second output node configured for being electrically connected to a second signal input node of the electrical signal monitoring equipment, the second output node being connected to the second input node; a first clamping module comprising a control terminal, a first conduction terminal electrically connected to the first input node, and a second conduction terminal electrically coupled to the first output node; a second clamping module comprising a control terminal, a first conduction terminal electrically connected to the first output node and a second conduction terminal electrically connected to the second output node; and a driving module comprising an input terminal electrically connected to the first input node, a first output terminal electrically connected to the control terminal of the first clamping module and a second output terminal electrically connected to the control terminal of the second clamping module. The driving module is configured to: sense a state change of the DUT; and generate a first control signal to switch on and off the first clamping module based on the state change of the DUT and a second control signal to turn on the second clamping module before the first clamping module being turned on and turned off the second clamping module after the first clamping module being turned off such that an output voltage across the first and second output nodes is clamped to indicate a drain-source voltage of the DUT.

BRIEF DESCRIPTION OF THE DRAWINGS

Aspects of the present disclosure may be readily understood from the following detailed description with reference to the accompanying figures. The illustrations may not necessarily be drawn to scale. That is, the dimensions of the various features may be arbitrarily increased or reduced for clarity of discussion. There may be distinctions between the artistic renditions in the present disclosure and the actual apparatus due to manufacturing processes and tolerances. Common reference numerals may be used throughout the drawings and the detailed description to indicate the same or similar components in various embodiments.

FIG. 13 depicts a flowchart of method for measuring dynamic on-resistance of a nitride-based device under test (DUT) with a measuring apparatus according to one embodiment of the present invention; and FIG. 14 depicts a flowchart of method for measuring dynamic on-resistance of a nitride-based device under test (DUT) with a measuring apparatus according to another embodiment of the present invention.

DETAILED DESCRIPTION

In the following description, preferred examples of the present disclosure will be set forth as embodiments which are to be regarded as illustrative rather than restrictive. Specific details may be omitted so as not to obscure the present disclosure; however, the disclosure is written to enable one skilled in the art to practice the teachings herein without undue experimentation.

Figure 1:
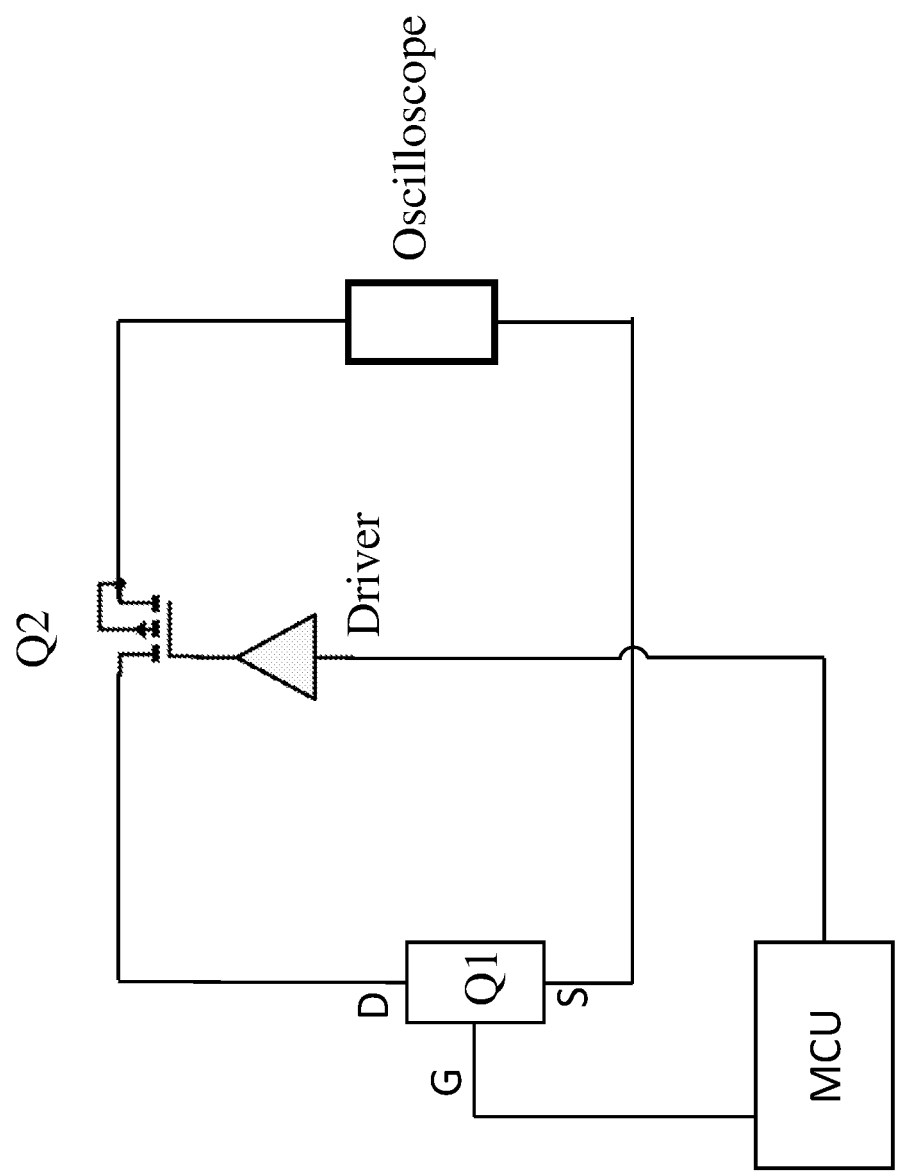
FIG. 1 depicts a dynamic on-resistance measuring circuit according to a comparative embodiment of the subject application.

FIG. 1 depicts a dynamic on-resistance measuring circuit according to a comparative embodiment of the subject application. In this comparative embodiment, a micro-controller unit (MCU) is used to drive a GaN power device under test Q1 as well as a switching device Q2 through a driver to actively clamp the drain-to-source voltage of the GaN power device Q1 to be measured by the oscilloscope. The active clamping circuit can provide higher measurement accuracy than the passive clamping circuit as the measured voltage is independent of diode temperature but its cost is relatively high as a special MCU with synchronization function for synchronizing Q2 with Q1 is required.

Figure 2:
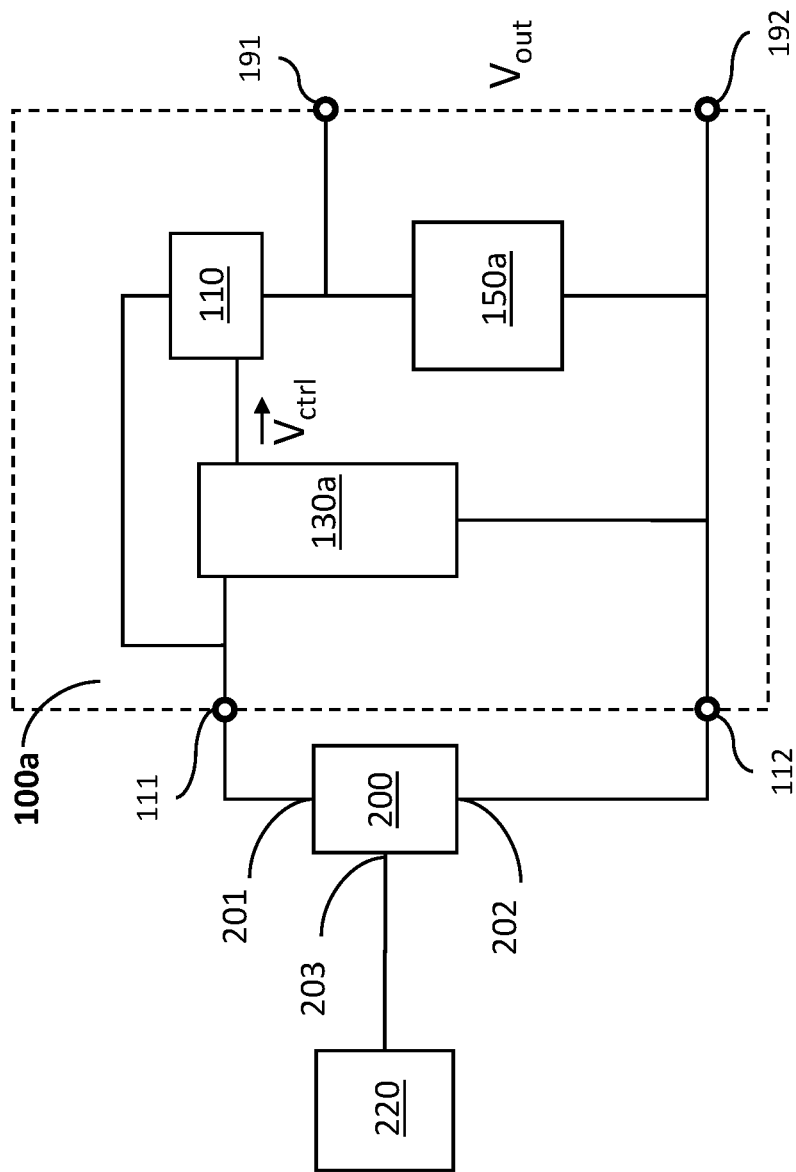
FIG. 2 depicts a circuit block diagram of a dynamic on-resistance measuring apparatus and how it is implemented to measure on-resistance of a nitride-based device under test (DUT) according to an embodiment of the subject application.

FIG. 2 depicts a circuit block diagram of a dynamic on-resistance measuring apparatus 100a and how it is implemented to measure on-resistance of a nitride-based device under test (DUT) 200 according to an embodiment of the subject application.

As shown, the DUT 200 may have a first conduction terminal 201 electrically connected to a DC power supply (not shown), a second conduction terminal 202 electrically connected to ground, and a control terminal 203 electrically connected to an output terminal 221 of a controller module 220. The controller module 220 may be configured to generate a control signal to switch on and off the DUT 200.

In some embodiments, the DUT 200 may be a AlGaN/GaN enhancement-mode field effect transistor (FET) device having a drain being the first conduction terminal 201, a source being the second conduction terminal 202 and a gate being the control terminal 203.

The measuring apparatus 100a may comprise an input interface comprising a first input node 111 configured for being electrically connected to the first conduction terminal 201 of the DUT 200, a second input node 112 configured for being electrically connected to the second conduction terminal 202 of DUT 200, and a control input node 113 configured for being electrically connected to the output terminal 221 of the controller module 220.

The measuring apparatus 100a may further comprise an output interface comprising a first output node 191 configured for being electrically connected to a first signal input node of an electrical signal monitoring equipment (not shown) and a second output node 192 electrically connected to the second input node and configured for being electrically connected to a second signal input node of the electrical signal monitoring equipment. The electrical signal monitoring equipment may be an oscilloscope or any signal analyzer for monitoring electrical signal waveforms from the measuring apparatus 100a.

The measuring apparatus 100a may further comprise a first clamping module 110 comprising a control terminal, a first conduction terminal and a second conduction terminal. The first conduction terminal of the first clamping module 110 is electrically connected to the first input node 111. The second conduction terminal of the first clamping module 110 is electrically coupled to the first output node 191.

The measuring apparatus 100a may further comprise a second clamping module 150a comprising a first terminal and a second terminal. The first terminal of the second clamping module 150a is electrically connected to the first output node 111. The second terminal of the second clamping module 150a is electrically connected to the second output node 191.

The measuring apparatus 100a may further comprise a driving module 130a comprising an input terminal and an output terminal. The input terminal of the driving module 130a is electrically connected to the first input node. The output terminal of the driving module 130a is electrically connected to the control terminal of the first clamping module 110.

The driving module 130a may be configured to: sense a state change of the DUT 200; and generate a control signal Vctrl to switch on and off the first clamping device 110a based on the state change of the DUT such that when the DUT is at an on-state, an output voltage Vout across the first and second output nodes 191, 192 is clamped to indicate a drain-source voltage of the DUT.

Figure 3:
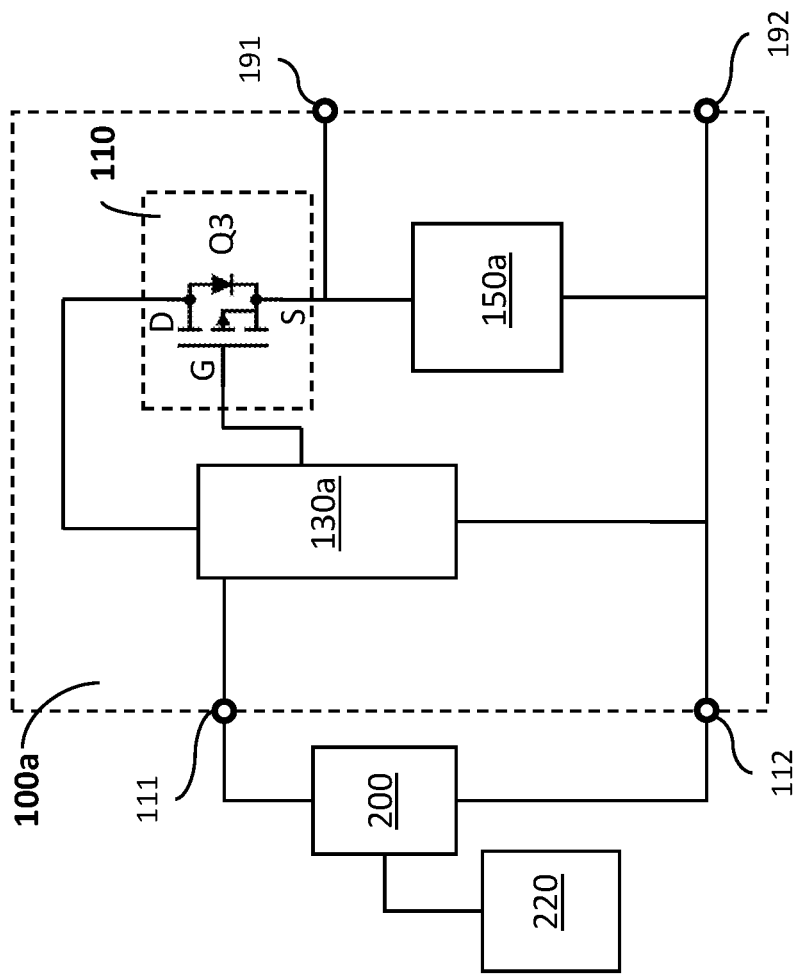
FIG. 3 depicts an exemplary circuit of a first clamping module and how it is implemented in the measuring apparatus of FIG. 2.

Referring to FIG. 3, the first clamping module 110 may comprise a transistor Q3 having a gate connected to the output terminal of the driving module 130a, a drain connected to the first input node 111 and a source connected to the first output node 191.

Figure 4:
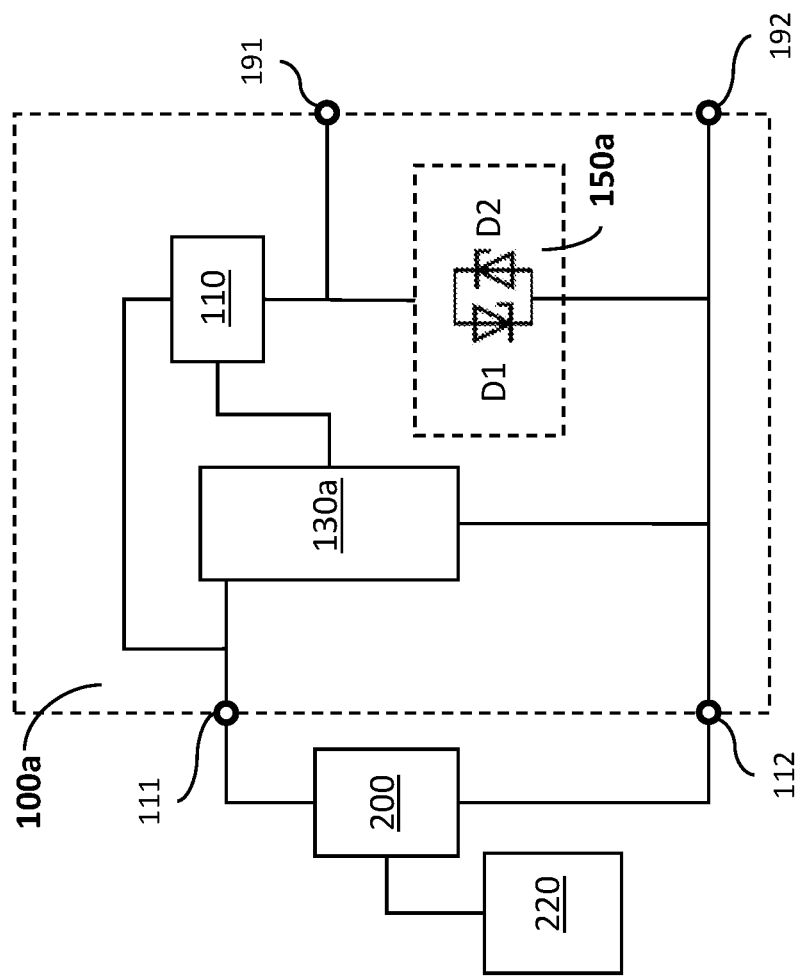
FIG. 4 depicts an exemplary circuit of a second clamping module and how it is implemented in the measuring apparatus of FIG. 2.
Figure 5:
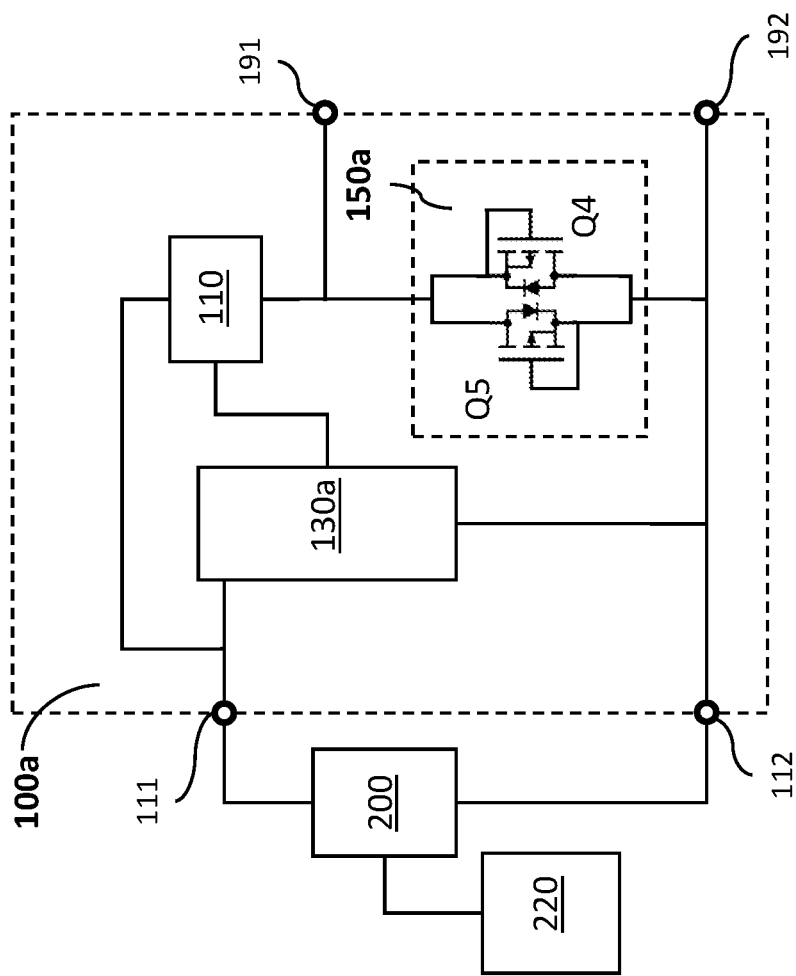
FIG. 5 depicts another exemplary circuit of the second clamping module and how it is implemented in the measuring apparatus of FIG. 2.

Referring to FIG. 4, the second clamping module 150a may comprise a pair of Schottky barrier diodes D1, D2 connected in anti-parallel between the first output node 191 and the second output node 192. Alternatively, referring to FIG. 5, the second clamping module 150a comprises a pair of transistors Q4, Q5. The transistor Q4 may have a gate and a source shorted together and connected to the first output node 191 and a drain connected to a second output node 192. The transistor Q5 may have a gate and a source shorted together and connected to the second output node 192 and a drain connected to the first output node 191.

Figure 6:
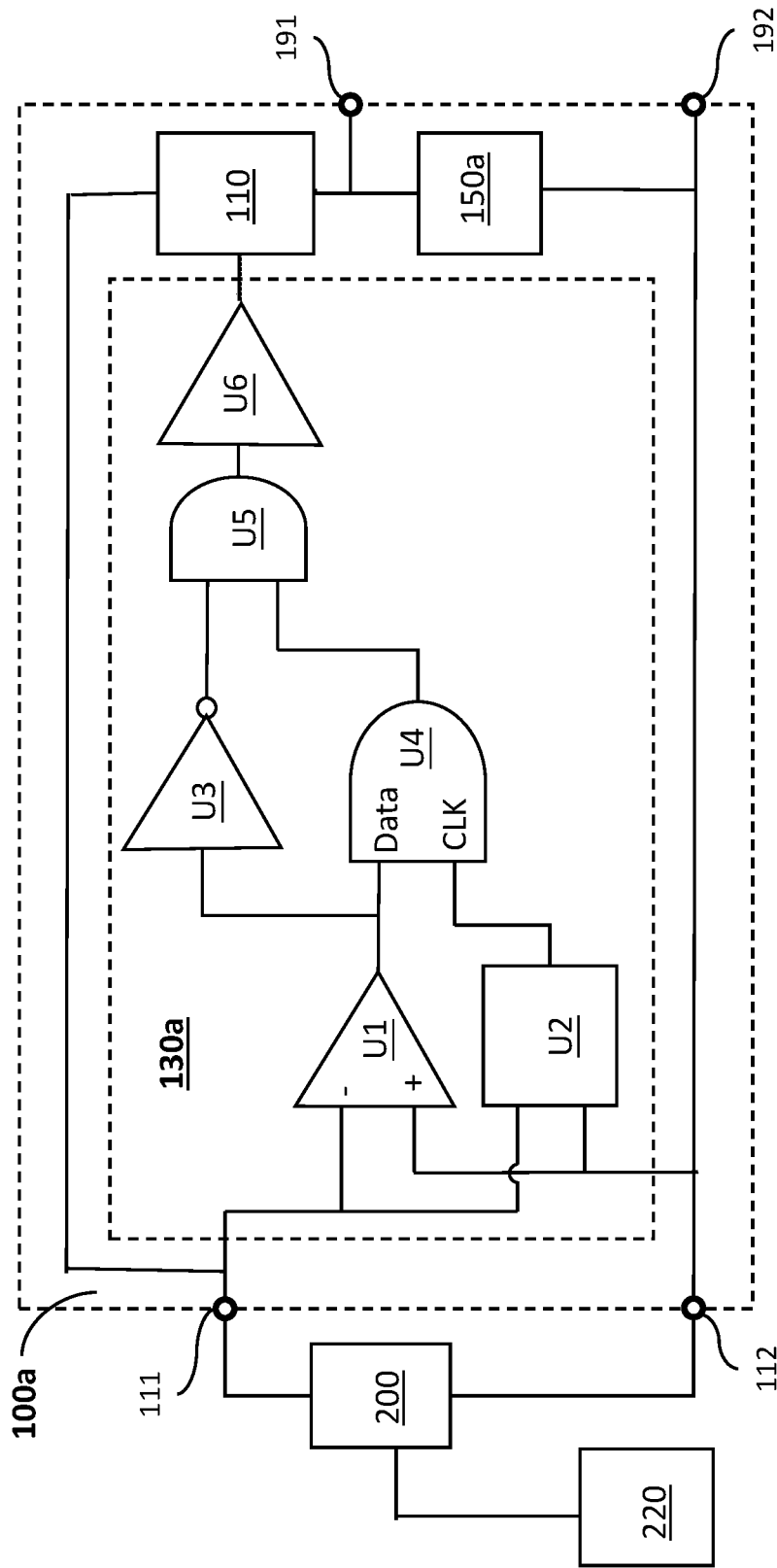
FIG. 6 depicts an exemplary circuit of a driving module in the measuring apparatus of FIG. 2.

Referring to FIG. 6, the driving module 130*a* may comprise a comparator U1, an edge detector U2, an inverter U3, a flip-flop U, an OR-gate U5 and an amplifier U6. The comparator U1 may have inverting input connected to the first input node 111 and a non-inverting input connected to the second input node 112. The edge detector U2 may have a first input connected to the first input node 111 and a second input connected to the second input node 112. The inverter U3 may have an input connected to an output of the comparator U1. The flip-flop U4 may have a data input connected to the output of the comparator U1 and a clock input connected to an output of the edge detector U2. The OR-gate U5 may have a first input connected to an output of the inverter U3 and a second input connected to an output of the flip-flop U4. The amplifier U6 may have an input connected to an output of the OR-gate U5 and an output connected to the control terminal of the first clamping module, that is acting as the output terminal of the driving module 130*a*.

Figure 7:
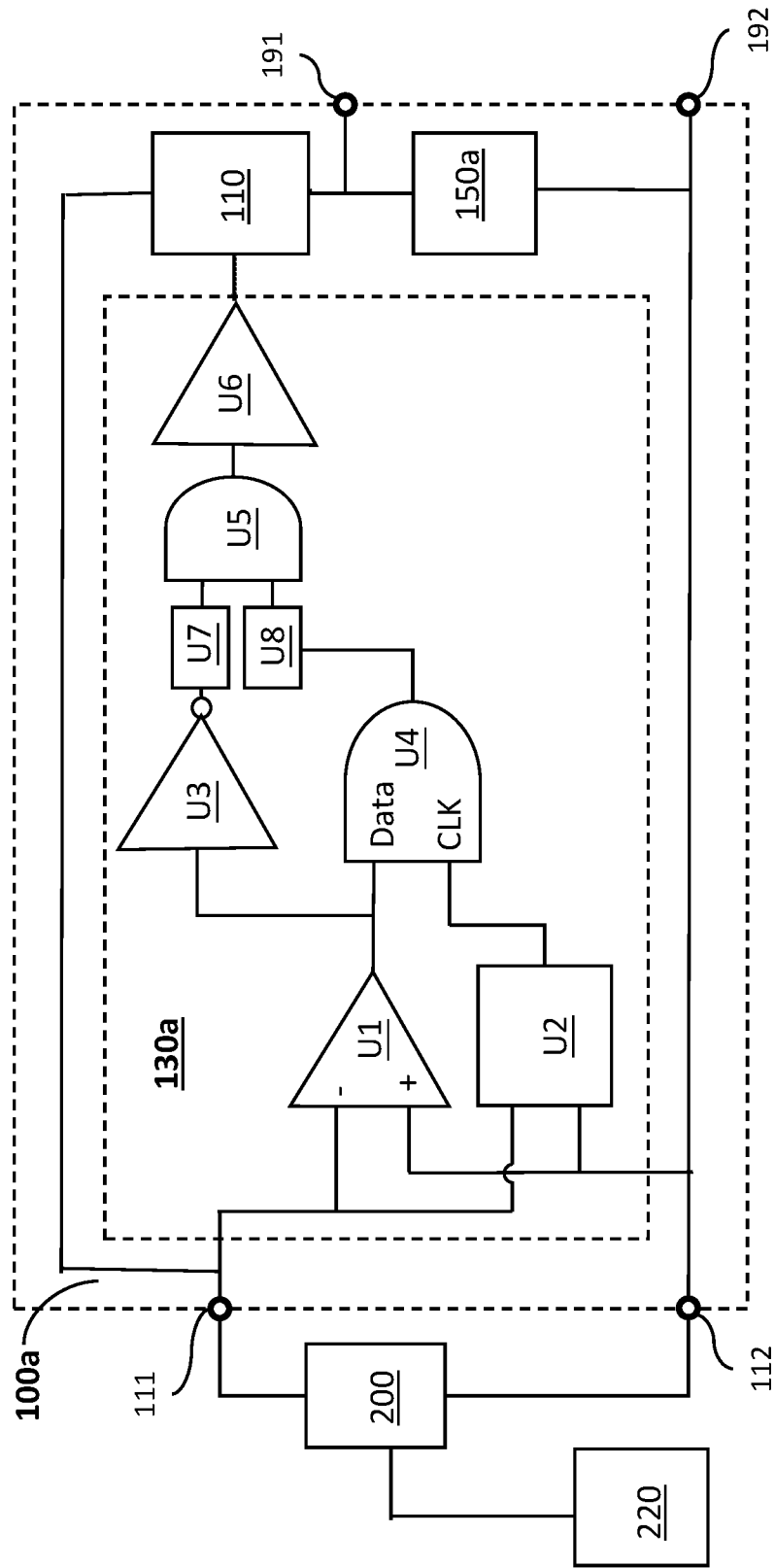
FIG. 7 depicts another exemplary circuit of a driving module in the measuring apparatus of FIG. 2.

Referring to FIG. 7, optionally, the driving module 130*a* may further comprise a delay circuit U7 connected between the inverter U3 and the OR-gate U5; and a delay circuit U8 connected between the flip-flop U4 and the OR-gate U5. That is, the delay circuit U7 may have an input connected to the output of the inverter U3. The delay circuit U8 may have an input connected to the output of the flip-flop U4. The OR-gate U5 may have a first input connected to an output of the delay circuit U7 and a second input connected to an output of the delay circuit U8.

Figure 8:
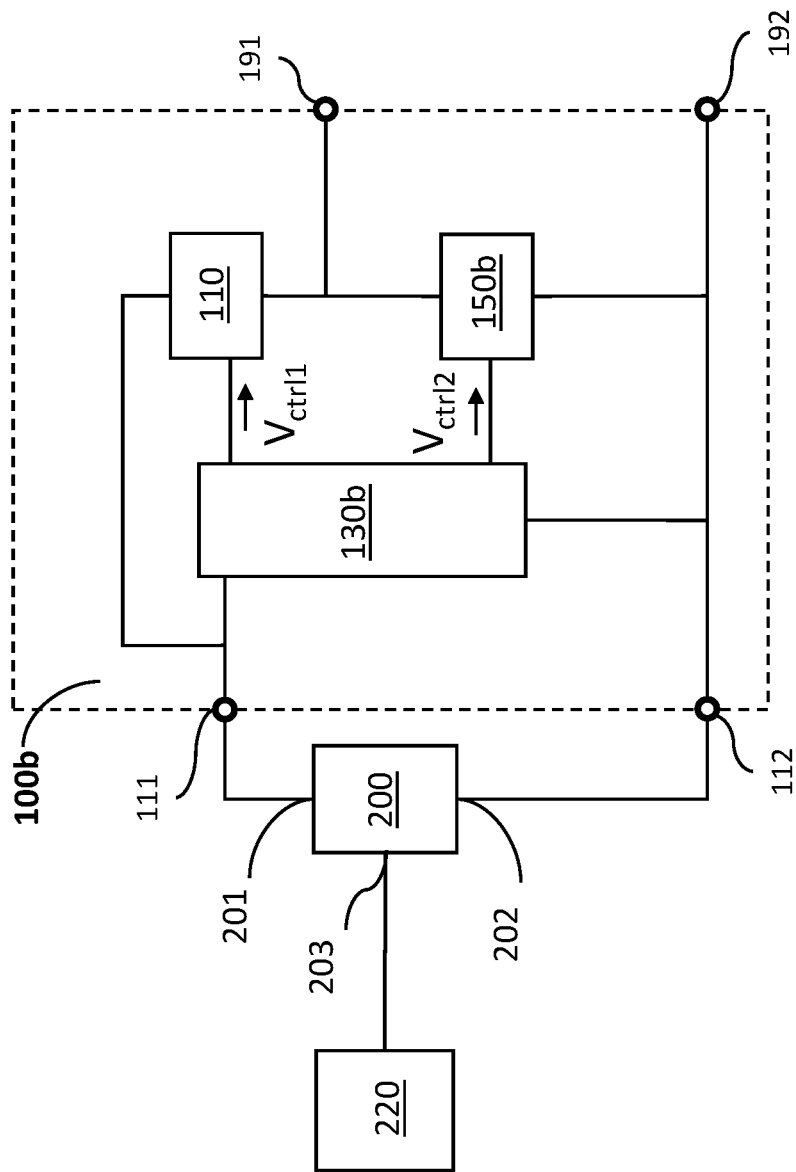
FIG. 8 depicts a circuit block diagram of a dynamic on-resistance measuring apparatus and how it is implemented to measure on-resistance of a nitride-based device under test (DUT) according to another embodiment of the subject application.

FIG. 8 depicts a circuit block diagram of a dynamic on-resistance measuring apparatus 100*b* and how it is implemented to measure on-resistance of a nitride-based device under test (DUT) 200 according to another embodiment of the subject application.

The measuring apparatus 100*b* may comprise an input interface comprising a first input node 111 configured for being electrically connected to the first conduction terminal 201 of the DUT 200, a second input node 112 configured for being electrically connected to the second conduction terminal 202 of DUT 200, and a control input node 113 configured for being electrically connected to the output terminal 221 of the controller module 220.

The measuring apparatus 100*b* may further comprise an output interface comprising a first output node 191 configured for being electrically connected to a first signal input node of an electrical signal monitoring equipment not shown and a second output node 192 electrically connected to the second input node and configured for being electrically connected to a second signal input node of the electrical signal monitoring equipment. The electrical signal monitoring equipment may be an oscilloscope or any signal analyzer for monitoring electrical signal waveforms from the measuring apparatus 100*b*.

The measuring apparatus 100*b* may further comprise a first clamping module 110 comprising a control terminal, a first conduction terminal and a second conduction terminal. The first conduction terminal of the first clamping module 110 is electrically connected to the first input node 111. The second conduction terminal of the first clamping module 110 is electrically coupled to the first output node 191.

The measuring apparatus 100*b* may further comprise a second clamping module 150*b* comprising a control terminal, a first conduction terminal and a second conduction terminal. The first conduction terminal of the second clamping module 150*b* is electrically connected to the first output node 111. The second conduction terminal of the second clamping module 150*b* is electrically connected to the second output node 191.

The measuring apparatus 100*b* may further comprise a driving module 130*b* comprising an input terminal, a first output terminal and a second output terminal. The input terminal of the driving module 130*b* is electrically connected to the first input node 111. The first output terminal of the driving module 130*b* is electrically connected to the control terminal of the first clamping module 110. The second output terminal of the driving module 130*b* is electrically connected to the control terminal of the second clamping module 150*b*.

The driving module 130*b* may be configured to: sense a state change of the DUT 200, generate a first control signal Vctrl1 to switch on and off the first clamping module based on the state change of the DUT, and generate a second control signal Vctrl2 to turn on the second clamping module before the first clamping module being turned on and turned off the second clamping module after the first clamping module being turned off. As such, an output voltage across the first and second output nodes is clamped to indicate a drain-source voltage of the DUT such that when the DUT is at an on-state, an output voltage Vout across the first and second output nodes 191, 192 is clamped to indicate a drain-source voltage of the DUT.

Figure 9:
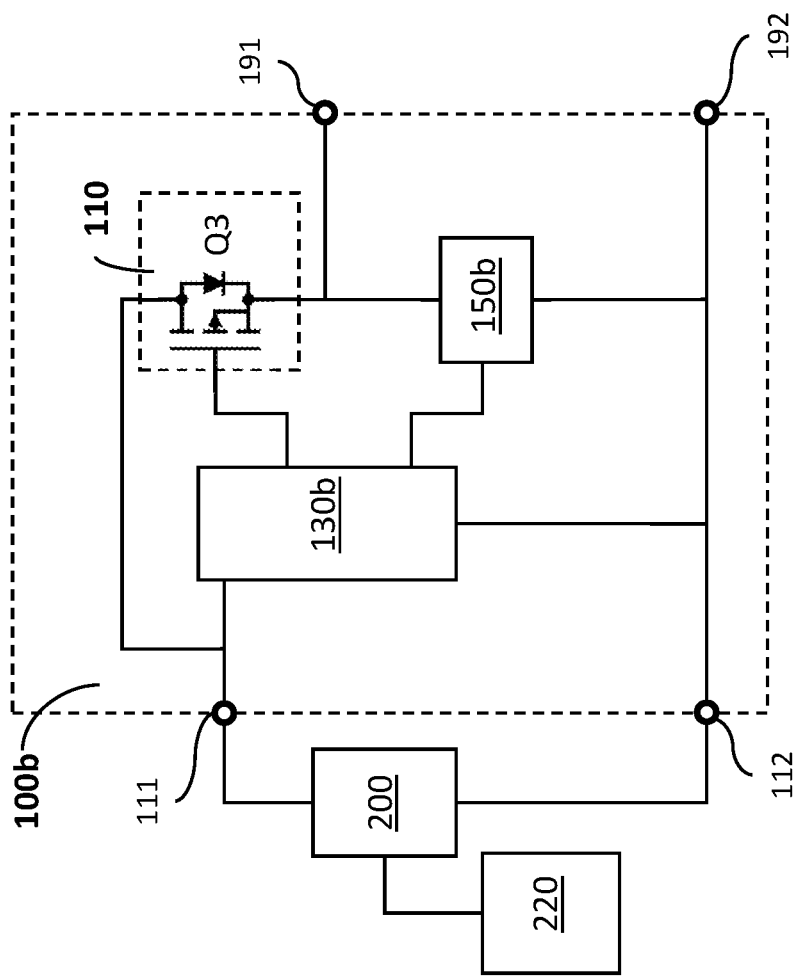
FIG. 9 depicts an exemplary circuit of a first clamping module and how it is implemented in the measuring apparatus of FIG. 8.

Referring to FIG. 9, the first clamping module 110 may comprise a comprise a transistor Q3 having a gate connected to the output terminal of the driving module 130*b*, a drain connected to the first input node 111 and a source connected to the first output node 191.

Figure 10:
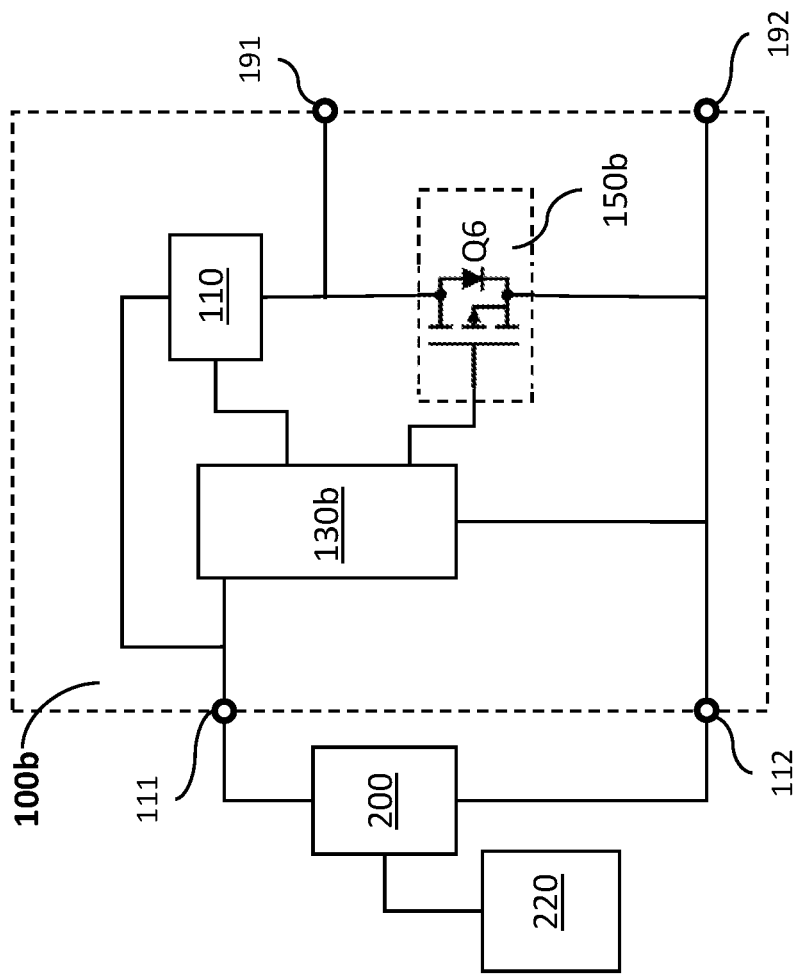
FIG. 10 depicts an exemplary circuit of a second clamping module and how it is implemented in the measuring apparatus of FIG. 8.

Referring to FIG. 10, the second clamping module 150*b* may comprise a transistor Q6 having a gate connected to the second output terminal of the driving module 130*b*, a drain connected to the first output node and a source connected to the second output node.

Figure 11:
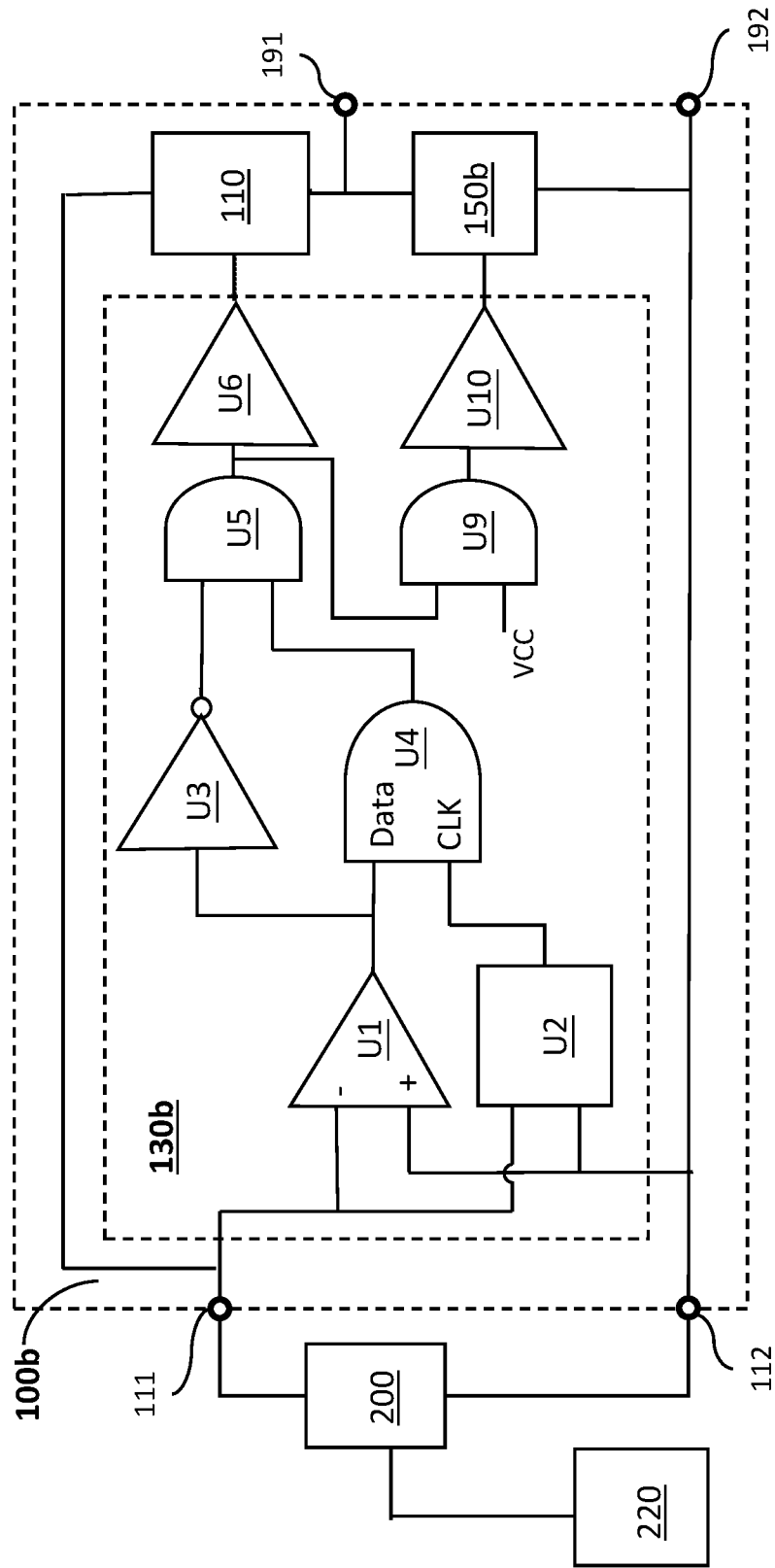
FIG. 11 depicts an exemplary circuit of a driving module in the measuring apparatus of FIG. 8.

Referring to FIG. 11, the driving module 130*b* may comprise a comparator U1, an edge detector U2, an inverter U3, a flip-flop U, an OR-gate U5, an amplifier U6, an OR-gate U9 and an amplifier U10. The comparator U1 may have inverting input connected to the first input node 111 and a non-inverting input connected to the second input node 112. The edge detector U2 may have a first input connected to the first input node 111 and a second input connected to the second input node 112. The inverter U3 may have an input connected to an output of the comparator U1. The flip-flop U4 may have a data input connected to the output of the comparator U1 and a clock input connected to an output of the edge detector U2. The OR-gate U5 may have a first input connected to an output of the inverter U3 and a second input connected to an output of the flip-flop U4. The amplifier U6 may have an input connected to an output of the OR-gate U5 and an output connected to the control terminal of the first clamping module, that is, acting as the first output terminal of the driving module 130*b*. The OR-gate U9 may have a first input connected to the output of the OR-gate U5 and a second input connected to a DC power supply. The amplifier U10 may have an input connected to an output of the OR-gate U9 and an output connected to the control terminal of the second clamping module, that is, acting as the second output terminal of the driving module 130*b*.

Figure 12:
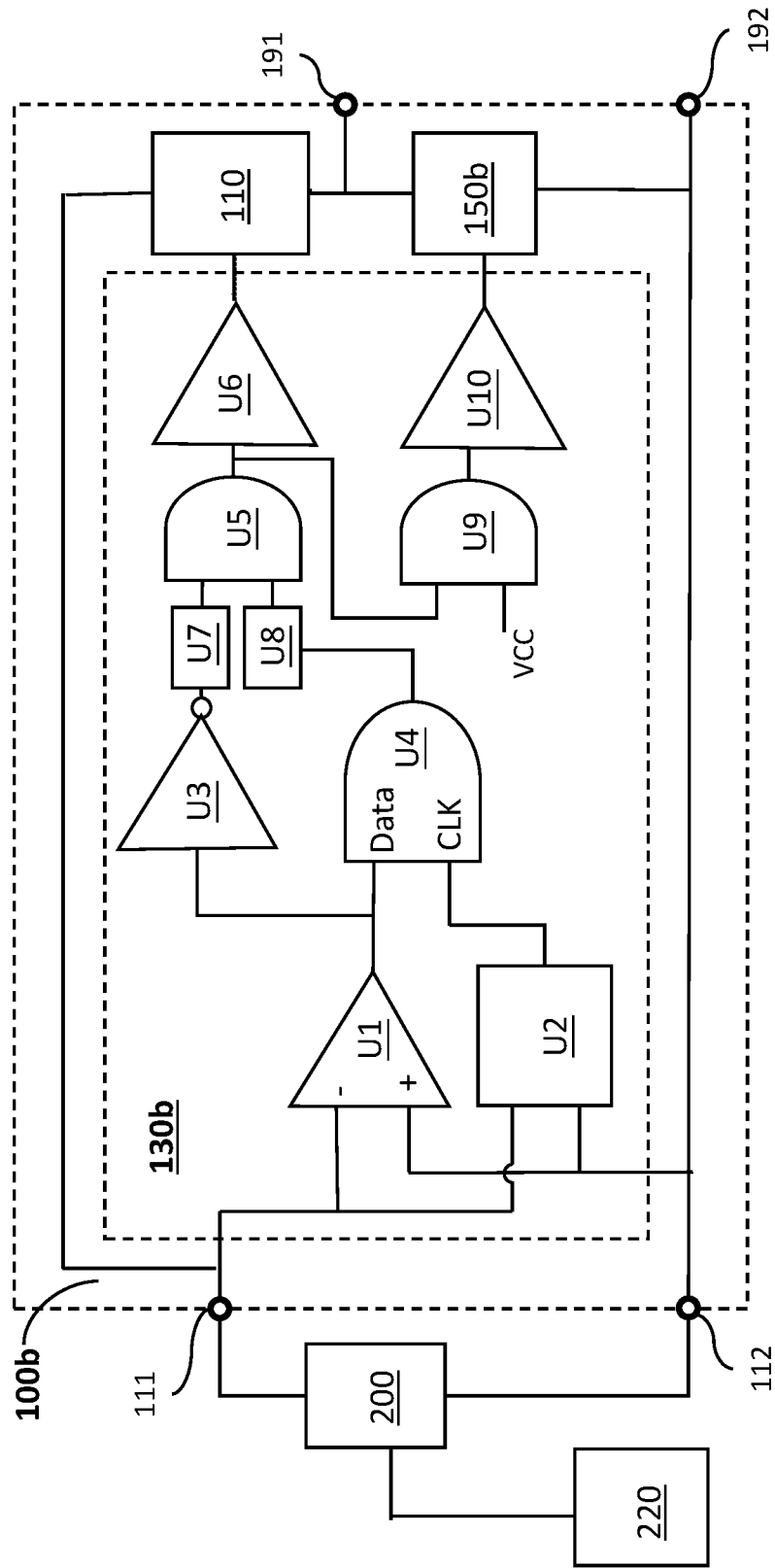
FIG. 12 depicts another exemplary circuit of a driving module in the measuring apparatus of FIG. 8.

Referring to FIG. 12, optionally, the driving module 130*b* may further comprise a delay circuit U7 connected between the inverter U3 and the OR-gate U5; and a delay circuit U8 connected between the flip-flop U4 and the OR-gate U5. That is, the delay circuit U7 may have an input connected to the output of the inverter U3. The delay circuit U8 may have an input connected to the output of the flip-flop U4. The OR-gate U5 may have a first input connected to an output of the delay circuit U7 and a second input connected to an output of the delay circuit U8.

In various embodiments, transistor Q3/Q4/Q5/Q6 may be constructed with, for example but not limited to, a high electron mobility transistor (HEMT) or a metal oxide semiconductor field effect transistor (MOSFET). The structure of the transistor Q3/Q4/Q5/Q6 may be selected from N-channel enhancement type, N-channel depletion type, P-channel enhancement type, or P-channel depletion type. The transistor Q3/Q4/Q5/Q6 may be formed of or include a direct bandgap material, such as an III-V compound, which includes, but not limited to, for example, GaAs, InP, GaN, InGaAs and AlGaAs. Preferably, the transistor Q3/Q4/Q5/Q6 is a AlGaN/GaN enhancement-mode HEMT.

The input interface of the measuring apparatus 100a/100b may be an electrical connector comprising a first pin or position being the first input node 111, a second pin or position being the second input node 112 and a third pin or position being the control input node 113.

Alternatively, the measuring apparatus 100a/100b may be connected to the DUT 200 by soldering the first input node to a solder pad connected to the first conduction terminal 201 of the DUT 200, the second input node 112 to a solder pad connected to the second conduction terminal 202 of DUT 200, and the control input node to a solder pad connected to the output terminal 221 of the controlling module 220.

The output interface of the measuring apparatus 100a/100b may be a coaxial RF connector, such as, but not limited to, a BNC (Bayonet Neill-Concelman) connector and a SMA (SubMiniature version A) connector.

FIG. 13 depicts a flowchart of method for measuring dynamic on-resistance of a nitride-based device under test (DUT) with a measuring apparatus according to one embodiment of the present invention. The DUT has a first conduction terminal, a second conduction terminal and a control terminal. The measuring apparatus includes a first clamping module, a second clamping module, a driving module, an input interface comprising a first input node configured for being electrically connected to a first conduction terminal of the DUT, a second input node configured for being electrically connected to a second conduction terminal of the DUT; and an output interface comprising a first output node configured for being electrically connected to a first signal input node of an electrical signal monitoring equipment and a second output node connected to the second input node and configured for being electrically connected to a second signal input node of the electrical signal monitoring equipment.

Referring to FIG. 13, the method may comprise the following steps:
S1302: connecting the control terminal of the DUT to an output of a controller;
S1304: connecting the first input node to a first input of the driving module and a first conduction terminal of the first clamping module;
S1306: connecting the second input node to a second input of the driving module;
S1308: connecting a first output of the driving module to a control terminal of the first clamping module;
S1310: connecting the first output node to a second conduction terminal of the first clamping module and a first conduction terminal of the second clamping module; and
S1312: connecting the second output node to a second conduction terminal of the second clamping module; and
S1314: connecting the second input node to the second output node.
S1316: configuring the driving module to: sense a state change of the DUT and generate a control signal to switch on and off the first clamping module based on the state change of the DUT such that when the DUT is at an on-state, an output voltage across the first and second output nodes is clamped to indicate a drain-source voltage of the DUT.

FIG. 14 depicts a flowchart of method for measuring dynamic on-resistance of a nitride-based device under test (DUT) with a measuring apparatus according to another embodiment of the present invention. The DUT has a first conduction terminal, a second conduction terminal and a control terminal. The measuring apparatus includes a first clamping module, a second clamping module, a driving module, an input interface comprising a first input node configured for being electrically connected to a first conduction terminal of the DUT, a second input node configured for being electrically connected to a second conduction terminal of the DUT; and an output interface comprising a first output node configured for being electrically connected to a first signal input node of an electrical signal monitoring equipment and a second output node connected to the second input node and configured for being electrically connected to a second signal input node of the electrical signal monitoring equipment.

Referring to FIG. 14, the method may comprise the following steps:
S1402: connecting the control terminal of the DUT to an output of a controller;
S1404: connecting the first input node to a first input of the driving module and a first conduction terminal of the first clamping module;
S1406: connecting the second input node to a second input of the driving module;
S1408: connecting a first output of the driving module to a control terminal of the first clamping module;
S1410: connecting a second output of the driving module to a control terminal of the second clamping module;
S1412: connecting the first output node to a second conduction terminal of the first clamping module and a first conduction terminal of the second clamping module;
S1414: connecting the second output node to a second conduction terminal of the second clamping module; and
S1416: connecting the second input node to the second output node.
S1418: configuring the driving module to: sense a state change of the DUT, generate a first control signal to switch on and off the first clamping module based on the state change of the DUT and generate a second control signal to turn on the second clamping module before the first clamping module being turned on and turned off the second clamping module after the first clamping module being turned off such that an output voltage across the first and second output nodes is clamped to indicate a drain-source voltage of the DUT.

The embodiments were chosen and described in order to best explain the principles of the invention and its practical application, thereby enabling others skilled in the art to understand the invention for various embodiments and with various modifications that are suited to the particular use contemplated. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations. While the apparatuses disclosed herein have been described with reference to particular structures, shapes, materials, composition of matter and relationships . . . etc., these descriptions and illustrations are not limiting. Modifications may be made to adapt a particular situation to the objective, spirit and scope of the present disclosure. All such modifications are intended to be within the scope of the claims appended hereto.

The invention claimed is:

1. An apparatus for measuring dynamic on-resistance of a nitride-based device under test (DUT) comprising a control terminal connected to a controller being configured to generate a control signal to switch on and off the DUT, the apparatus comprising:
   an input interface comprising a first input node configured for being electrically connected to a first conduction terminal of the DUT, a second input node configured for being electrically connected to a second conduction terminal of the DUT;
   an output interface comprising a first output node configured for being electrically connected to a first signal input node of an electrical signal monitoring equipment and a second output node connected configured for being electrically connected to a second signal input node of the electrical signal monitoring equipment, and the second output node being connected to the second input node;
   a first clamping module comprising a control terminal, a first conduction terminal electrically connected to the first input node, and a second conduction terminal electrically coupled to the first output node;
   a second clamping module comprising a first terminal electrically connected to the first output node, and a second terminal electrically connected to the second output node; and
   a driving module comprising an input terminal electrically connected to the first input node and an output terminal electrically connected to the control terminal of the first clamping module; and
   wherein the driving module is configured to:
      sense a state change of the DUT; and
      generate a control signal to switch on and off the first clamping module based on the state change of the DUT such that when the DUT is at an on-state, an output voltage across the first and second output nodes is clamped to indicate a drain-source voltage of the DUT.

2. The apparatus according to claim 1, wherein the first clamping module comprises a transistor having a gate connected to the output terminal of the driving module, a drain connected to the first input node and a source connected to the first output node.

3. The apparatus according to claim 1, wherein the second clamping module comprises a pair of Schottky barrier diodes connected in anti-parallel between the first output node and the second output node.

4. The apparatus according to claim 1, wherein the second clamping module comprises a pair of transistors including:
   a first transistor having a gate and a source shorted together and connected to the first output node and a drain connected to a second output node; and
   a second transistor having a gate and a source shorted together and connected to the second output node and a drain connected to the first output node.

5. The apparatus according to claim 1, wherein the driving module comprises:
   a comparator having an inverting input connected to the first input node and a non-inverting input connected to the second input node;
   an edge detector having a first input connected to the first input node and a second input connected to the second input node;
   an inverter having an input connected to an output of the comparator;
   a flip-flop having a data input connected to the output of the comparator and a clock input connected to an output of the edge detector;
   an OR-gate having a first input connected to an output of the inverter and a second input connected to an output of the flip-flop; and
   an amplifier having an input connected to an output of the OR-gate and an output connected to the control terminal of the first clamping module.

6. The apparatus according to claim 1, wherein the driving module comprises:
   a comparator having an inverting input connected to the first input node and a non-inverting input connected to the second input node;
   an edge detector having a first input connected to the first input node and a second input connected to the second input node;
   an inverter having an input connected to an output of the comparator;
   a flip-flop having a data input connected to the output of the comparator and a clock input connected to an output of the edge detector;
   a first delay circuit having an input connected to an output of the inverter;
   a second delay circuit having an input connected to an output of the flip-flop;
   an OR-gate having a first input connected to an output of the first delay circuit and a second input connected to an output of the second delay circuit; and
   an amplifier having an input connected to an output of the OR-gate and an output connected to the control terminal of the first clamping module.

7. An apparatus for measuring dynamic on-resistance of a nitride-based device under test (DUT) comprising a control terminal connected to a controller being configured to generate a control signal to switch on and off the DUT, the apparatus comprising:
   an input interface comprising a first input node configured for being electrically connected to a first conduction terminal of the DUT, a second input node configured for being electrically connected to a second conduction terminal of the DUT;
   an output interface comprising a first output node configured for being electrically connected to a first signal input node of an electrical signal monitoring equipment and a second output node configured for being electrically connected to a second signal input node of the electrical signal monitoring equipment, the second output node being connected to the second input node;

a first clamping module comprising a control terminal, a first conduction terminal electrically connected to the first input node, and a second conduction terminal electrically coupled to the first output node;

a second clamping module comprising a control terminal, a first conduction terminal electrically connected to the first output node and a second conduction terminal electrically connected to the second output node; and a driving module comprising an input terminal electrically connected to the first input node, a first output terminal electrically connected to the control terminal of the first clamping module and a second output terminal electrically connected to the control terminal of the second clamping module; and wherein the driving module is configured to:
sense a state change of the DUT;
generate a first control signal to switch on and off the first clamping module based on the state change of the DUT and generate a second control signal to turn on the second clamping module before the first clamping module being turned on and turned off the second clamping module after the first clamping module being turned off such that an output voltage across the first and second output nodes is clamped to indicate a drain-source voltage of the DUT.

8. The apparatus according to claim 7, wherein the driving module comprises:
a comparator having an inverting input connected to the first input node and a non-inverting input connected to the second input node;
an edge detector having a first input connected to the first input node and a second input connected to the second input node;
an inverter having an input connected to an output of the comparator;
a flip-flop having a data input connected to the output of the comparator and a clock input connected to an output of the edge detector;
a first OR-gate having a first input connected to an output of the inverter and a second input connected to an output of the flip-flop;
a first amplifier having an input connected to an output of the first OR-gate and an output connected to the control terminal of the first clamping module;
a second OR-gate having a first input connected to the output of the first OR-gate and a second input connected to a DC power supply; and
a second amplifier having an input connected to an output of the second OR-gate and an output connected to the control terminal of the second clamping module.

9. The apparatus according to claim 7, wherein the driving module comprises:
a comparator having an inverting input connected to the first input node, a non-inverting input connected to the second input node;
an edge detector having a first input connected to the first input node, a second input connected to the second input node;
an inverter having an input connected to an output of the comparator;
a flip-flop having a data input connected to the output of the comparator and a clock input connected to an output of the edge detector;
a first delay circuit having an input connected to an output of the inverter;

a second delay circuit having an input connected to an output of the flip-flop;
a first OR-gate having a first input connected to an output of the first delay circuit and a second input connected to an output of the second delay circuit; and
a first amplifier having an input connected to an output of the first OR-gate and an output connected to the control terminal of the first clamping module;
a second OR-gate having a first input connected to the output of the first OR-gate and a second input connected to a DC power supply; and
a second amplifier having an input connected to an output of the second OR-gate and an output connected to the control terminal of the second clamping module.

10. A method for measuring dynamic on-resistance of a nitride-based device under test (DUT) having a first conduction terminal, a second conduction terminal and a control terminal with an apparatus, the apparatus including a first clamping module, a second clamping module, a driving module, an input interface comprising a first input node configured for being electrically connected to a first conduction terminal of the DUT, a second input node configured for being electrically connected to a second conduction terminal of the DUT; and an output interface comprising a first output node configured for being electrically connected to a first signal input node of an electrical signal monitoring equipment and a second output node connected to the second input node and configured for being electrically connected to a second signal input node of the electrical signal monitoring equipment, the method comprising:
connecting the control terminal of the DUT to an output of a controller;
connecting the first input node to a first input of the driving module and a first conduction terminal of the first clamping module;
connecting the second input node to a second input of the driving module;
connecting a first output of the driving module to a control terminal of the first clamping module;
connecting the first output node to a second conduction terminal of the first clamping module and a first conduction terminal of the second clamping module;
connecting the second output node to a second conduction terminal of the second clamping module; and
connecting the second input node to the second output node.

11. The method according to claim 10, further comprising configuring the driving module to:
sense a state change of the DUT; and
generate a control signal to switch on and off the first clamping module based on the state change of the DUT such that when the DUT is at an on-state, an output voltage across the first and second output nodes is clamped to indicate a drain-source voltage of the DUT.

12. The method according to claim 11, wherein the first clamping module comprises a transistor having a gate connected to the first output of the driving module, a drain connected to the first input node and a source connected to the first output node.

13. The method according to claim 11, wherein the second clamping module comprises a pair of Schottky barrier diodes connected in anti-parallel between the first output node and the second output node.

14. The method according to claim 11, wherein the second clamping module comprises a pair of transistors including:

a first transistor having a gate and a source shorted together and connected to the first output node and a drain connected to a second output node;

a second transistor having a gate and a source shorted together and connected to the second output node and a drain connected to the first output node.

15. The method according to claim 11, wherein the driving module comprises:

a comparator having an inverting input connected to the first input node, a non-inverting input connected to the second input node;

an edge detector having a first input connected to the first input node, a second input connected to the second input node;

an inverter having an input connected to an output of the comparator;

a flip-flop having a data input connected to the output of the comparator and a clock input connected to an output of the edge detector;

an OR-gate having a first input connected to an output of the inverter and a second input connected to an output of the flip-flop; and an amplifier having an input connected to an output of the OR-gate and an output connected to the control terminal of the first clamping module.

16. The method according to claim 11, wherein the driving module comprises:

a comparator having an inverting input connected to the first input node, a non-inverting input connected to the second input node;

an edge detector having a first input connected to the first input node, a second input connected to the second input node;

an inverter having an input connected to an output of the comparator;

a flip-flop having a data input connected to the output of the comparator and a clock input connected to an output of the edge detector;

a first delay circuit having an input connected to an output of the inverter;

a second delay circuit having an input connected to an output of the flip-flop;

an OR-gate having a first input connected to an output of the first delay circuit and a second input connected to an output of the second delay circuit; and an amplifier having an input connected to an output of the OR-gate and an output connected to the control terminal of the first clamping module.

17. The method according to claim 10, further comprising:

connecting a second output of the driving module to a control terminal of the second clamping module; and configuring the driving module to:

sense a state change of the DUT;

generate a first control signal to switch on and off the first clamping module based on the state change of the DUT; and generate a second control signal to turn on the second clamping module before the first clamping module being turned on and turned off the second clamping module after the first clamping module being turned off such that an output voltage across the first and second output nodes is clamped to indicate a drain-source voltage of the DUT.

18. The method according to claim 17, wherein the driving module comprises:

a comparator having an inverting input connected to the first input node, a non-inverting input connected to the second input node;

an edge detector having a first input connected to the first input node, a second input connected to the second input node;

an inverter having an input connected to an output of the comparator;

a flip-flop having a data input connected to the output of the comparator and a clock input connected to an output of the edge detector;

a first OR-gate having a first input connected to an output of the inverter and a second input connected to an output of the flip-flop;

a first amplifier having an input connected to an output of the first OR-gate and an output connected to the control terminal of the first clamping module;

a second OR-gate having a first input connected to the output of the first OR-gate and a second input connected to a DC power supply; and a second amplifier having an input connected to an output of the second OR-gate and an output connected to the control terminal of the second clamping module.

19. The method according to claim 17, wherein the driving module comprises:

a comparator having an inverting input connected to the first input node, a non-inverting input connected to the second input node;

an edge detector having a first input connected to the first input node, a second input connected to the second input node;

an inverter having an input connected to an output of the comparator;

a flip-flop having a data input connected to the output of the comparator and a clock input connected to an output of the edge detector;

a first delay circuit having an input connected to an output of the inverter;

a second delay circuit having an input connected to an output of the flip-flop;

a first OR-gate having a first input connected to an output of the first delay circuit and a second input connected to an output of the second delay circuit; and a first amplifier having an input connected to an output of the first OR-gate and an output connected to the control terminal of the first clamping module;

a second OR-gate having a first input connected to the output of the first OR-gate and a second input connected to a DC power supply; and a second amplifier having an input connected to an output of the second OR-gate and an output connected to the control terminal of the second clamping module.

* * * * *